(12) United States Patent
Skultety-Betz et al.

(10) Patent No.: US 7,759,939 B2
(45) Date of Patent: Jul. 20, 2010

(54) SENSOR FOR LOCATING METALLIC OBJECTS AND METHOD FOR EVALUATING MEASUREMENT SIGNAL OF SUCH A SENSOR

(75) Inventors: Uwe Skultety-Betz, Leinfelden-Echterdingen (DE); Bjoern Haase, Stuttgart (DE); Kai Renz, Leinfelden Echterdingen (DE)

(73) Assignee: Robert Bosch GmbH, Stuttgart (DE)

( * ) Notice: Subject to any disclaimer, the term of this patent is extended or adjusted under 35 U.S.C. 154(b) by 463 days.

(21) Appl. No.: 11/573,572

(22) PCT Filed: Jul. 25, 2005

(86) PCT No.: PCT/EP2005/053617
§ 371 (c)(1),
(2), (4) Date: Feb. 12, 2007

(87) PCT Pub. No.: WO2006/034901
PCT Pub. Date: Apr. 6, 2006

(65) Prior Publication Data
US 2008/0303517 A1 Dec. 11, 2008

(30) Foreign Application Priority Data
Sep. 29, 2004 (DE) .................. 10 2004 047 189

(51) Int. Cl.
*G01V 3/08* (2006.01)
*G01R 19/00* (2006.01)
(52) U.S. Cl. ................... 324/326; 324/242; 324/67
(58) Field of Classification Search ............ 324/67, 324/228, 239, 242, 243, 326, 329
See application file for complete search history.

(56) References Cited

U.S. PATENT DOCUMENTS

| 2,680,226 | A |   | 6/1954 | Whitehead et al. |
|---|---|---|---|---|
| 4,270,545 | A | * | 6/1981 | Rodler ...................... 600/407 |
| 4,513,257 | A |   | 4/1985 | Miyamoto et al. |
| 5,068,612 | A | * | 11/1991 | Auslander et al. ........... 324/327 |
| 5,262,722 | A | * | 11/1993 | Hedengren et al. .......... 324/242 |
| 5,640,092 | A | * | 6/1997 | Motazed et al. ............. 324/326 |
| 5,729,143 | A |   | 3/1998 | Tavernetti et al. |
| 5,952,822 | A |   | 9/1999 | Kayserman et al. |
| 7,202,768 | B1 | * | 4/2007 | Harvey et al. ............... 336/232 |
| 2002/0105331 | A1 | * | 8/2002 | Brune et al. ................. 324/326 |
| 2002/0112855 | A1 |   | 8/2002 | Arndt et al. |
| 2005/0104594 | A1 | * | 5/2005 | Nelson et al. ............... 324/326 |

FOREIGN PATENT DOCUMENTS

DE 44 23 661 1/1996
DE 198 50 749 3/2000

(Continued)

*Primary Examiner*—Kenneth J Whittington
(74) *Attorney, Agent, or Firm*—Michael J. Striker

(57) ABSTRACT

A sensor for locating metallic objects, in particular a metal sensor for building materials, includes at least one transmission coil and at least one reception conductor loop system that are inductively coupled to one another. The reception conductor loop system is made up of conductor structures on a printed circuit board. A second reception conductor loop system can be provided, which is situated coaxial to the first reception conductor loop system in a common first plane with it on the printed circuit board. The sensor preferably operates in a frequency range between 1 kHz and 10 kHz.

27 Claims, 6 Drawing Sheets

FOREIGN PATENT DOCUMENTS

| | | |
|---|---|---|
| DE | 103 53 741 | 6/2004 |
| EP | 0 163 574 | 12/1985 |
| EP | 1 059 542 | 12/2000 |
| EP | 2 092 989 | 4/2001 |
| GB | 1 187 458 | 4/1970 |
| JP | 2001-168930 * | 6/2001 |
| WO | 96/20416 | 7/1996 |

* cited by examiner

SENSOR FOR LOCATING METALLIC OBJECTS AND METHOD FOR EVALUATING MEASUREMENT SIGNAL OF SUCH A SENSOR

The present invention relates to a sensor for locating metallic objects and to a method for evaluating measurement signals of such a sensor.

BACKGROUND OF THE INVENTION

As a rule, sensors or detectors for locating metallic objects concealed, for example, in building materials currently function with inductive methods. These methods make use of the fact that both conductive and ferromagnetic materials influence the properties of an electromagnetic coil brought into their vicinity. The changes in the inductive properties caused by metallic objects are registered by a reception circuit of such a detector. This makes it possible to basically locate metallic objects, for example, enclosed in a wall by moving one or more coils across the wall.

Magnetic and nonmagnetic metallic objects influence the inductive sensor in different ways. For example, the arrival of a ferromagnetic iron bar into the magnetic field of a sensor coil can be recognized by an increase in the inductance of the coil. By contrast, conductive, nonmagnetic materials, due to the eddy currents that are induced in them, cause an increase in the losses of the detector coils. The presence of conductive, nonmagnetic objects in the vicinity of the sensor can therefore be recognized by a reduction in the quality of the sensor coils. The impact that a metallic object has on the properties of an inductive sensor is generally a function of the frequency spectrum used for the sensor. Inductive sensors, which are primarily intended to react to ferromagnetic objects —in particular those made of iron and steel, function efficiently at frequencies in the range of 10 kHz and below since the magnetic susceptibility of most magnetic materials drops rapidly at higher frequencies.

One technical challenge in the detection of metallic objects is that the objects to be located have very little impact on the coil or coils of the sensor arrangement. This is primarily true for the influence of non-ferromagnetic objects such as the technically significant material copper.

As a rule, the detectors based on an inductive method have a high offset, i.e. a powerful signal can be picked up in the sensor, which is measured by the reception circuit of the detector even without the influence of an external metallic object, i.e. one to be located. Such a high offset makes it hard to detect very small inductive changes caused by a metallic object brought into the vicinity of the detector.

The change $\Delta L$ in the inductance L of a sensor coil that is caused by metallic objects is very slight in practice and in particular, is very much less than the inductance L that the same coil has in the absence of metallic objects. The greatest technical challenge in the detection, therefore, is not the low absolute value of the change in the sensor properties, i.e. the inductance change $\Delta L$, but rather the often almost infinitesimally slight relative change in the sensor properties, i.e. an extremely small quotient $\Delta L/L$.

The offset is a particular source of interference in the detection of nonmagnetic materials. The conventional way to achieve a high measuring capacity is to use particularly high quality sensor coils. The slight reduction in the coil quality caused by the object to be located is then only slightly concealed by the coil losses that are present anyway. The usual approach is comprised of using sensor reception coils with a large number of turns and ferrite cores with particularly low magnetic losses.

The need to detect a very slight change in the sensor properties in a very large offset signal requires the use of strictly toleranced and therefore expensive components for such a detector and also requires very low-drift analog electronics, both of which considerably increase the costs for the sensor and for the corresponding locating device.

In order to counteract this offset problem, numerous approaches have been taken in the prior art, all of which share the common goal of reducing the sensor signal that is present in the absence of metallic objects and thus increasing the relative signal changes.

Often, a multi-step approach is taken in which, for example in a first step, an arrangement of sensor coils is used, which has the capacity to completely eliminate or compensate for the signal offset in the ideal case. The compensation quality that can be achieved in practice, however, frequently depends on production tolerances so that a complete elimination of the signal offset frequently requires an additional process, for fine compensation so to speak.

The shared concept that forms the basis of the family of metal detectors collectively referred to below as "inductive compensation sensors" is comprised in constructing the detector out of more than one individual coil and in particular, distinguishing between a winding system for magnetic field excitation and a winding system for detection. In particular, it is possible to use arrangements that position inversely wound conductor loops in space so that the voltages induced in the reception system by the excitation magnetic field disappear in the absence of metallic objects. This is achieved, for example, by virtue of the fact that an excitation magnetic field induces voltages of the same amplitudes in inversely oriented reception conductor loops, but these voltages have opposite signs due to the orientation and therefore cancel each other out.

DE 101 22 741 A1 has disclosed a detector for locating metal objects, which has a reception coil and a first transmission or excitation coil that are inductively coupled to each other. In order to produce the smallest possible offset signal in the detector, a second transmission coil is provided, which is likewise inductively coupled to the reception coil. The reception coil and the two transmission or excitation coils are situated concentric to a shared axis; with regard to their numbers of turns, orientation, and/or dimensions, the two transmission coils are sized so that the fluxes they excite in the reception coil compensate for each other precisely in the absence of metallic objects.

U.S. Pat. No. 5,729,143 has disclosed a detector whose purpose is to suppress to the greatest extent possible the above-mentioned offset of the measurement signal. To this end, the detector in U.S. Pat. No. 5,729,143 has a transmission coil equipped with a transmitter and has a reception coil equipped with a receiver. The transmission coil and the reception coil of the detector are coupled to each other inductively so that they partially overlap each other. The transmitter supplies an alternating current to the transmission coil. Through its inductive coupling to the reception coil, this current-carrying transmission coil excites a first partial flux in the reception coil in the overlapping region of the two coils and excites a second partial flux in the remaining area of the reception coil. The distance between the centers of the transmission coil and reception coil can then be selected so that these two partial fluxes, which have opposite signs, precisely compensate for each other. If this is the case, then when there is no external metallic object in the vicinity of the coil arrangement, the current-carrying transmission coil does not induce any current in the reception coil so that in this ideal case, the receiver would also not measure any offset signal. Only if the coil arrangement is brought into the vicinity of a metallic object does the field generated by the transmission coil experience interference so that a non-negligible flux is then excited in the reception coil, thus generating a measurement signal in the reception coil, which measurement signal is not influenced by an offset signal and can be evaluated by the receiver or an evaluation circuit connected to it.

The relative spacing of the centers of the transmission coil and reception coil is thus an extremely critical parameter so that the ideally-to-be-assumed absence of an induced voltage in the reception coil can, in practice, only be implemented with a great deal of technical complexity. It has turned out that this approach does not permit implementation of a sufficient compensation of the flux components under the conditions of a series production of such a sensor.

For this reason, U.S. Pat. No. 5,729,143 proposes an electronic circuit that achieves the compensation afterwards by electronic means and also renders such a sensor practically usable.

The method described in U.S. Pat. No. 5,729,143 functions at a single frequency. On the excitation side, a magnetic alternating field of a particular frequency f is generated and the induced voltage components are evaluated in a frequency-selective fashion specifically at this frequency f in the reception windings by means of suitable analog and digital filters. At the frequency f, the voltage U(f) induced in the reception windings by the incorrect magnetic compensation of the reception and excitation system has a temperature-dependent amplitude and phase position that is also subject to additional series tolerances. The method in U.S. Pat. No. 5,729,143, then, is based on taking the voltages induced in the reception windings and adding a correction voltage to them in analog fashion, whose amplitude and phase position precisely compensate for the error voltage U(f) at the working frequency f. To this end, at the frequency f, a microprocessor generates a phase-controlled and amplitude-controlled correction signal. The amplitude and phase position required for the compensation in this case depend on the phase shift provoked by the components of the circuits in the excitation and reception branch. But as a result of this, the required correction signal is also subject to a temperature drift, among other things. In order to also be able to compensate for the error voltage U(f) when there are changes in the working temperature, the microprocessor must track the phase position and amplitude of the correction signal over the temperature. As a rule, this requires recalibration of the sensor by the user.

EP 1092989 A1 has disclosed an alternative method for compensating for a residual offset that remains, for example, due to production tolerances. In lieu of adding a correction voltage to the detection voltage that is induced in the reception windings, this method works with additional corrective magnetic fields. To this end, the system of the magnetic field excitation is not comprised of just the primary excitation coil, but so-called trim windings and correction windings are also added. The difference between the trim winding and correction winding is that the correction windings are series connected to the primary excitation coil and therefore always have the same current flowing through them, whereas the so-called trim windings can be supplied with an adjustable fraction of the current flowing in the correction and excitation coils. In this way, it is possible for there to be no induced voltage in the detector coils with the absence of metallic objects in the vicinity of the sensor. The method in EP 1092989 A1 thus depends significantly less on component tolerances and drifts in the transmission and reception circuits. In addition, the measurement is not limited to a selected working frequency since the compensation is largely independent of the frequency used. But comparatively speaking, the design of a sensor according to EP 1092989 A1 is significantly more complex. While the sensor in U.S. Pat. No. 5,729,143 properly functions with only one coil each for the transmission and reception circuit, the design in EP 1092989 A1 requires ten coils in the transmission or excitation path and four coils for the reception path.

In compensation sensors, metallic objects initially generate signal changes of significantly smaller amplitude than in sensors that do not differentiate between an independent excitation and reception system. Not only do the voltages induced by the original excitation magnetic field cancel themselves out in the reception branch, but also the weak magnetic field changes clause by the object to be detected are generally subject to a certain degree of compensation.

Also in compensation sensors, strict limits are placed on the use of magnetic cores. The quality of the compensation in this case is highly dependent on the magnetic susceptibility of the ferrite used, which frequently cannot be toleranced strictly enough. In practice, therefore, air-cored coils are used as a rule in compensation sensors, where it is necessary to accept the fact that the coil quality decreases drastically and in particular, it is more difficult to detect nonmagnetic materials.

A standard approach for circumventing the problem of the weak signal and the low quality of air-cored coils in compensation sensors, as explained in detail in EP 1092989 A1, is to select a turns number that is as high as possible in reception coil systems.

OBJECT OF THE INVENTION

Based on the detectors and sensors of the prior art, the object of the invention is to disclose a compensation sensor of the type mentioned at the beginning, whose properties and measurement results change as little as possible with the ambient temperature so that even without regular calibration processes, it is possible to achieve good measurement results using such a sensor.

Another object of the invention is to implement a sensor of this kind in a particularly inexpensive fashion and with the lowest possible production tolerance requirements and a low assembly cost.

The object forming the basis of the present invention is attained by means of a sensor for locating metallic objects that has the features of claim 1.

SUMMARY OF THE INVENTION

The sensor for locating metallic objects according to the invention has a transmission or excitation coil and reception conductor structures that are coupled to one another inductively. According to the present invention, at least the reception conductor structures are implemented by means of a system of conductor paths on a printed circuit board.

In the sensor according to the invention, at least one reception conductor loop system is advantageously replaced by a copper structure of a printed circuit board, i.e. a printed circuit. This can be produced, for example, in the form of a print layout. In such an embodiment of conductor loops as copper structures, on the one hand, no additional significant costs or increased amount of time are required to produce and assemble the reception coil system. In addition to the virtually nonexistent costs, the embodiment of the reception conductor loop system in the form of a conductor path structure on a printed circuit board according to the invention has the additional advantage that the conductor loops can be embodied with a particularly high dimensional fidelity. Producing copper structures on printed circuit boards with a precision of 25 micrometers does not pose a significant technical problem.

The use of conductor path structures as reception conductor structures requires a significant reduction in the number of turns in the reception system of the sensor. This in turn results in a very low inductance of the reception system. The subject of the invention is the realization that it is possible—despite the extremely low inductance per unit length of the reception system—to construct a high-quality inductive sensor, which, in comparison to conventional compensation sensors is potentially even more significantly temperature-stable and easy-to-produce; another subject of the invention is the measurement and evaluation processes required to implement this.

Advantageous modifications and embodiments of the detector according to the invention ensue from the features of the dependent claims.

Particularly for locating nonmagnetic materials, the use of higher frequencies is advantageous since at these frequencies, the penetration depth of the magnetic field into the object to be located decreases and the eddy currents produced in the object are thus more significant. But since the penetration depth in copper at a working frequency of 100 kHz is already on the order of roughly 0.2 mm, it is not generally constructive in practice to increase the working frequency much above 200 kHz for purposes of increasing the detection quality. At least when using an inductive sensor to find metal in building materials, this length is already significantly less than the dimension of relevant objects such as electrical transmission lines, water lines, or steel reinforcements.

Sensors that are intended to react to both conductive and ferromagnetic objects must strike a compromise with respect to the frequency selection and for this reason, suitably function in a frequency range between 1 kHz and 10 kHz. A frequency of 4-6 kHz is particularly suitable since in this frequency window, iron-containing objects and conductive objects of comparable size generate measurement signals that are virtually identical in amplitude.

It is also advisable to use a measurement frequency of between 1 kHz and 100 kHz because this makes it possible to construct evaluation circuits and electronic components in a particularly inexpensive manner and with a simple design.

To precisely adjust the compensation of the voltages induced in the reception path in a compensation sensor, it is necessary to take into account the fact that the "detector coils" not only function inductively but also have a non-negligible capacitance per unit length. Detector coils for locating devices are usually produced using enameled copper wire. The insulation varnish typically used for these coils has a thickness of only a few micrometers. Two windings situated next to each other consequently function not only as an inductance but also to a certain extent as a capacitor, with the insulation varnish functioning as a dielectric. Due to the low insulation thickness with the use of insulation varnish, the parasitic capacitance can easily assume non-negligible values. This is particularly the case with coils that are wound in multiple layers. Since it is important to determine the inductance up to a magnitude of one ppm in order to implement optimum compensation geometries, this capacitive influence can no longer be ignored even when frequencies of only a few kHz are used. It should be noted here that the currents connected via the parasitic capacitors are stepped up in the other windings of the coil and thus can in sum yield a significant interference potential. The parasitic capacitance is thus also subject to a significant temperature drift since the permittivity of the insulation varnish is not thermally stable. This is particularly true when so-called thermosetting varnishes are used.

Advantageously, the conductor coils of the reception system according to the invention are automatically planar, i.e. are, in the figurative sense, "wound on" in a single layer. In this way, it is possible to reduce the capacitance per unit length in a simple fashion. The planar, one-layer geometry makes it possible to keep the distance from loop to loop high and therefore to reduce the parasitic capacitance per unit length. This also assures that the remaining capacitance per unit length is practically invariant thermally speaking so that a temperature drift of the parasitic capacitances is no longer as relevant.

The printed circuit board on which the conductor path structures of the reception conductor loop system are provided is of particular significance in the sensor according to the invention. This printed circuit board serves not only as a support material for the necessary electronic circuits of the sensor, but is also, as a functional part, an integral component of the sensor. Various components of the sensor are provided in the form of a conductor path structure directly on the printed circuit board, which renders a multitude of individual components superfluous.

Because of the small number of conductor loops, in the sensor according to the invention, in addition to the inductive coupling of the excitation and reception system, the parasitic capacitive coupling is generally no longer negligible. In order to be able to suppress these parasitic couplings to a large extent, additional shielding conductor structures are advantageously provided on the printed circuit board between the wound excitation coil and the reception structures and are embodied directly in the form of conductor path structures. These structures to which ground potential can be applied do not incur any appreciable added costs to the manufacture of the sensor. In particular, the planar geometry of the reception conductor loops according to the invention also makes it possible for flat shielding structures to deliver good results.

When the shielding lines or structures are being installed, though, care must be taken that no current loops can close within the shielding geometry. For this reason, the shielding structures are advantageously embodied as meandering or comb-like structures comprised of the thinnest possible individual conductors.

The coil functioning as a transmission coil or excitation coil is situated in a second, parallel plane that is vertically offset in relation to the printed circuit board, i.e. shifted in a z direction. This advantageously makes it possible for additional windings to be situated even beneath the transmission coil, thus making it possible to significantly reduce the requirements regarding the positioning and dimensioning tolerances of the excitation coil.

An incorrect positioning of the excitation coil in relation to the provided position has less of an effect on the differently oriented individual conductor loops, the greater the distance is from the reception winding in question. In other words, when the excitation coil is incorrectly positioned, in a reception conductor loop that is situated closer, the voltage induced is more powerful than in a conductor loop oriented in the opposite direction and therefore situated farther away. As a result, a favorable compensation of the induced voltage amplitudes can only be assured with a high degree of position fidelity.

In addition to the windings and conductor loops of the reception system, which are appropriately situated far away from the transmission coil, compensation windings are situated below the excitation coil, which, in the ideal case, should have no influence on the measurement signal generated by the object to be detected.

The number and position of the respective compensation windings should be dimensioned so that the dependence of the induced voltage in the reception conductor loop system on a vertically incorrect positioning of the excitation coil, i.e. a misadjustment in the z direction, is compensated for as precisely as possible. A slightly incorrect positioning of the excitation or transmission coil in the z direction therefore no longer affects the total voltage induced in the reception windings or no longer affects it as powerfully.

The compensation windings are advantageously also embodied in the form of copper structures on a printed circuit board. Ideally, the compensation windings and the windings of the reception coils are provided on the same printed circuit board as the conductor path structure.

With a detector geometry of this kind, there is a significantly reduced tolerance sensitivity with regard to the positioning of the excitation coil in its vertical direction (z direction) above the plane of the reception coils.

In an advantageous modification of the sensor according to the invention, the compensation windings of reception conductor loop systems are provided on two opposite sides of a printed circuit board. In this case, two compensation loops—which have as close to the same geometry as possible and are wound clockwise and counterclockwise—are placed a different heights, e.g. on two sides of the printed circuit board, and are advantageously each embodied in the form of a conductor path structure.

Because the compensation winding pairs inside the sensor, on the top and bottom surface of the printed circuit board are embodied as virtually identical, the directivity characteristic of the sensor is not distorted at large distances from the metallic objects. It is thus possible to situate the compensation windings beneath the excitation coil without negatively influencing the directivity characteristic of the inductive sensor.

The transmission coil of the sensor according to the invention is advantageously mounted on a winding body that is then fastened to the printed circuit board during assembly, for example by being soldered or clipped in place. The windings of the excitation or transmission coil are thus situated at a certain defined height above the printed circuit board and therefore above the plane of the reception conductor structures. The winding body that supports the windings of the transmission coil thus advantageously also serves as a mechanical spacer that keeps the transmission coil and its windings spaced apart from the conductor loops of the reception system and thus assures a definite distance from the transmission and reception windings.

In a particularly advantageous fashion, the excitation coil is electrically contacted via contact pins, which are let into an injection molded part and soldered into bores provided for them on the printed circuit board. In order to permit a stable mechanical contact, it is helpful to use more than the two electrically required contact pins and to provide, for example, one or two blind pins, i.e. ones that are not electrically contacted. In this manner, the excitation coil can also be precisely fixed mechanically by means of a soldering process.

A detector of this kind for locating metallic objects, with the sensor geometry according to the invention, thus advantageously requires only a single conventional coil and renders additional wound sensor coils just as superfluous as the otherwise required high-precision positioning of the individual coils. Furthermore, the sensor according to the invention also has a good detection directivity and demonstrates only a slight drift behavior in the event of temperature changes.

The above described measures make it possible to significantly reduce the signal offset that remains in spite of production tolerances and thermal drift. In order to enable the detection of very small metallic objects, however, it can also be desirable to reduce the offset even further.

By contrast with the known method of electrical fine compensation or excitation field modification, the embodiment according to the present invention is comprised of modifying the reception geometry. To this end, switching means can be used to connect or disconnect conductor loops or fractions thereof to and from the reception system. With a suitable dimensioning of these equalizing loops, it is possible to assure that the voltage induced in these conductor tracks precisely compensates for the remaining offset voltage.

It is particularly advantageous from a technical standpoint if the conductor loops for the fine compensation are embodied in the form of conductor tracks on a conductor path since this likewise achieves the production-dictated high dimensional fidelity of a few tens of sum and the possibility of selecting almost any geometry for these equalizing conductor loops.

The use of conductor tracks on the printed circuit board to replace the coils of the reception system and/or to implement shunt resistors and/or equalization windings has a series of consequences for the subsequent signal processing that has led to evaluation electronics according to the invention and to a corresponding evaluation method.

On the one hand, the steps described in the preceding sections have enabled offset suppression to such a significant degree that for the sensor according to the invention, only drift effects are now of any significance, which were not visible in conventional detectors because they were usually completely concealed by the drift of the offset remaining in them. In the sensor according to the invention, the change of the ohmic resistance of the excitation coil with the temperature now becomes particularly apparent. The invention describes an advantageous embodiment in which a shunt resistor is used to measure the change of the current in the excitation coil and a compensation for these drift effects is successful. In this case, a measurement voltage is advantageously picked up and evaluated on two sides of a shunt resistor through which the excitation current flows. Using two pick-up points advantageously makes it possible to compensate for a variation of the ground potential on the printed circuit board. In an advantageous embodiment, the resistance-determining material of the shunt resistor itself is comprised of copper.

With the knowledge of the current and the phase position of the current in the excitation branch, a reduction, for example, in the measurement amplitude—which is caused, for example, by the fact that the current in the excitation signal decreases due to the increase in copper resistance of the excitation coil that rises along with the temperature—can be mathematically compensated for in the same way as a possibly resulting phase shift.

A shunt resistor of this kind can also be comprised of a conductor track on the printed circuit board. Because of the high amplification factor of the evaluation circuit of such a sensor, very low voltage amplitudes in the shunt resistor suffice so that this can also be embodied in the form of a short meandering structure comprised of copper conductor tracks on the printed circuit board, thus eliminating the need for an additional separate component. In practice, roughly 1-2 cm of conductor structure suffices as a shunt resistor.

In a particularly advantageous embodiment of the sensor according to the invention, the current in the shunt resistor is measured by the same measuring amplifier that is used to evaluate the voltage induced in the reception conductor loop system. This can be implemented through the use of suitable switching means at the input of the measuring amplifier. The advantage is that this causes the long-term and temperature drift effects within the measuring amplifier circuit to act on the measurement of shunt signals in exactly the same way as they do on the coil signals. Furthermore, this advantageously avoids the costs for constructing a separate measuring amplifier for the shunt voltage, which results in a significant cost reduction even when taking into account the costs for the required switching means.

In the sensor according to the invention, the advantages of the high dimensional fidelity in the reception system and the offset compensation that can be achieved with it are primarily a result of the fact that the number of detector windings is extremely limited. The extremely low signal levels that this gives rise to, with voltages on the order of only a few tens of nV, require specific circuitry-based embodiments and a suitable signal processing in order to reduce the noise bandwidth and to suppress parasitic interference signals in the evaluation of the measurement signals.

At the low signal levels and the consequently required high amplification factors, on the one hand, care must be taken to provide the measuring amplifier with a particularly low-noise design, which can be implemented in a particularly advantageous fashion by using bipolar input stages of the measuring amplifier and very low-impedance feedback resistors. On the other hand, the combination of an extremely high amplification factor and a low signal level results in the fact that, for example, a crosstalk of interference signals in the supply of the measuring amplifier at its input can become significant. According to the present invention, a suitable switching means is used to connect the input of the measuring amplifier directly to ground potential in order to be able to measure the amplitude of these interference signals and to subtract them from the measurement signals in a subsequent digital signal processing.

In order to evaluate the sensor according to the invention, a narrow-band digital filtration of the measurement signals is carried out in order to reduce the noise bandwidth. In this case, a digital generation of the excitation signal and a phase-synchronous analog/digital conversion of the output signal of a measuring amplifier of the sensor are advantageously carried out. The frequency of the analog/digital conversion advantageously corresponds to at least four times the oscillation frequency of the magnetic fields.

The invention makes it possible to implement a reasonably priced sensor that renders superfluous as many cost-intensive components and device elements as possible by virtue of the fact that the printed circuit board of the sensor is used not only as a support material for the electronic circuits, but is also, as a functional part, an integral component of the sensor in that various components are provided directly in the form of conductor path structures of the functional part.

This is achieved, for example, by replacing the wound reception coil that has been typically used up to now with the present invention's conductor tracks on the printed circuit board and by providing suitable conductor tracks on the printed circuit board for shielding the excitation and detector coils in order to suppress a capacitive coupling of the windings. In addition, it is possible to also implement a shunt resistor directly by means of a conductor track of this printed circuit board, which makes it possible to measure the current in the excitation branch of the sensor and thus to determine the temperature drift of the current in the excitation coil.

Through the use of suitable switching means, the evaluation of the measurement signals and shunt signals can advantageously occur in one and the same amplifier, which ideally makes it possible to separately measure a possibly existing background comprised of parasitic interference signals. As a result, drift effects, for example, occur in the same direction during the amplification and can be compensated for.

This makes it possible to implement an inductive compensation sensor that has an advantageous embodiment for rough compensation of the offset signal of an inductive sensor in a first step, by avoiding additional coils and taking into account production tolerances, permits an advantageous embodiment for temperature-invariant fine tuning of this sensor in a second step, and by means of its evaluation circuit, makes possible advantageous embodiments and methods for solving specific technical problems for a sensor of this kind such as extremely low signal amplitudes by means of an analog and digital signal processing.

The sensor according to the invention, with its above-explained advantages, thus makes it possible to produce a reliable and reasonably priced measuring device, in particular a detector for locating metallic objects, which delivers good measurement results without a regular calibration process and independently of the temperature. A measuring device of this kind can, for example, be embodied in the form of a hand-held locating device.

It is also advantageously possible for the sensor according to the invention to be integrated into or mounted onto a machine tool in order to permit the user to work with such a machine in a safe and secure fashion. For example, the sensor can be integrated into a drilling or chiseling tool or can be embodied in the form of a module that can be attached to such a tool. One advantageous possible mounting location for the sensor according to the invention is a dust evacuation unit that is or can be attached to the machine tool and, dictated by its function, is used in the vicinity of a wall to be machined.

BRIEF DESCRIPTION OF THE DRAWINGS

Exemplary embodiments of the sensor according to the invention are shown in the drawings and will be explained in detail in the description that follows. The figures of the drawings, their description, and the claims contain numerous features in combination. Those skilled in the art will also consider these features individually and unite them in other meaningful combinations, which are also held to have been disclosed in the specification.

DETAILED DESCRIPTION OF THE EXEMPLARY EMBODIMENTS

As an introduction, the description below starts briefly with the principle of rough compensation for the offset known from the prior art when three concentric sensor coils are used.

The subject of the subsequent section is the principle of the present invention, according to which the rough compensation that can be implemented with the design reacts less sensitively to production and assembly tolerances. The discussion particularly concentrates on the use of additional compensation windings for this purpose and demonstrates how to prevent these compensation windings from influencing the directivity characteristic of the sensor.

Then, a layout of an exemplary embodiment is described that demonstrates the implementation of the sensor principle according to the invention. In conjunction with this example, an illustration is then given as to how shielding geometries can be used to suppress capacitive coupling between the excitation path and the reception path and how, with the aid of switching means, a fine tuning of the offset is possible by virtue of the fact that conductor loops on the printed circuit board can be selectively connected to it or disconnected from it.

The final section of the description concerns an exemplary embodiment of circuitry-based designs and the method of signal processing, which designs and method are particularly necessary for assuring a good measuring capacity despite the extremely low signal amplitudes specific to the invention.

Figure 1:
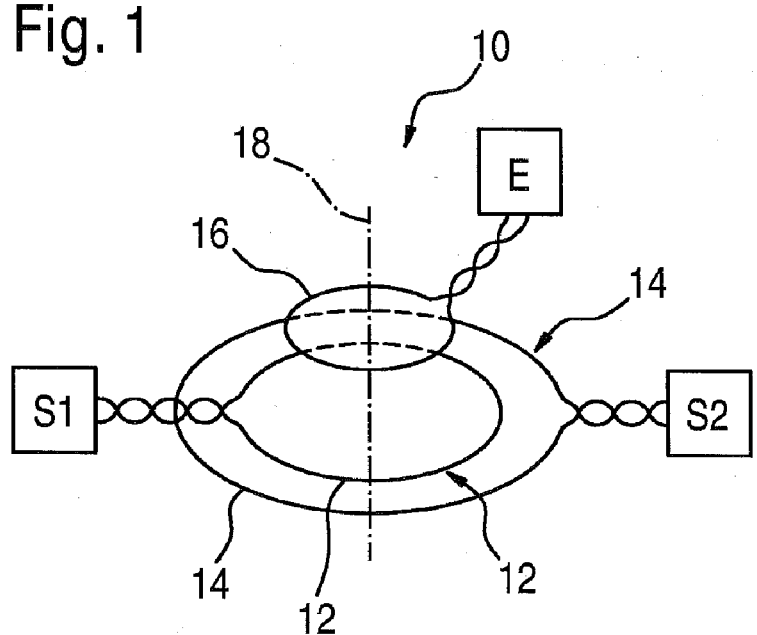
FIG. 1 is a schematic depiction of the basic layout of a sensor geometry of a sensor for locating metallic objects according to the prior art.

In order to illustrate the basic principle of a compensation sensor, FIG. 1 shows the basic design of a sensor or detector for locating metallic objects according to the prior art. In the context of this document, the terms "detector" and "sensor" are used synonymously. The sensor geometry 10 of such a detector has three coils: a first transmission coil 12 that is connected to a first transmitter S1, a second transmission coil 14 that is connected to a second transmitter S2, and a reception coil 16 that is connected to a receiver E. Each coil here is represented in the form of a circular line. The specific feature of the arrangement of these three coils 12, 14, 16 is that they are all arranged concentric to a common axis 18. In this case, the individual coils 12, 14, 16 have different outer dimensions so that the coil 12 can be inserted into the coil 14 coaxial to the axis 18.

The transmitters S1 and S2 supply their two transmission coils 12 and 14 with opposite-phase alternating currents. As a result, the first transmission coil 12 induces a flux in the reception coil 16 that is oriented opposite from the flux that the second transmission coil 14 induces in the reception coil 16. The two fluxes induced in the reception coil 16 compensate for each other so that the receiver E does not detect any reception signal in the reception coil 16 when no external metallic object is situated in the vicinity of the coil arrangement 10. The flux $\phi$ that the individual transmission coils 12 and 14 excite in the reception coil 16 depends on different variables such as the turns number and geometry of the coils 12 and 14, the amplitudes of the currents supplied to the two transmission coils 12 and 14, and the reciprocal phase position of these currents.

In the detectors of the prior art, these variables must in the end be optimized so that when no metallic object is present and when current is flowing through the transmission coils 12 and 14, no flux or as little flux 4 as possible is excited in the reception coil 16. In the coil arrangement 10 according to FIG. 1, the first transmission coil 12 that is connected to the first transmitter S1 and a second transmission coil 14 that is connected to a second transmitter S2 are situated coaxial to each other in a common plane. The reception coil 16 is situated in a plane that is offset from that of the two transmission coils 12 and 14.

Figure 2:
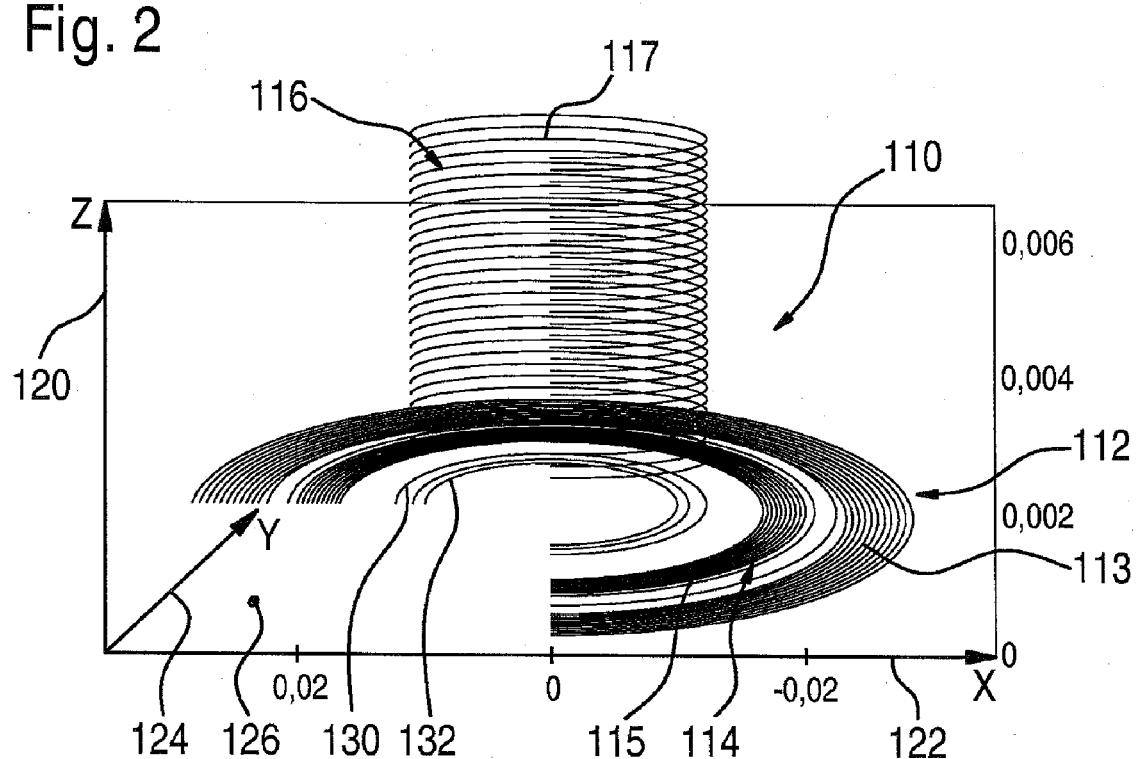
FIG. 2 is a simplified, schematic depiction of a first exemplary embodiment of a coil arrangement of the sensor according to the invention.

FIG. 2 is a very simplified schematic depiction of a first exemplary embodiment of a sensor geometry 110 for a sensor according to the invention for locating metallic objects. This optimized design of a sensor geometry reduces the tolerance sensitivity with regard to the positioning of the excitation coil in the vertical direction. The sensor geometry 110 according to FIG. 2 has two blocks of inversely oriented reception conductor loops 112 and 114 that are situated coaxial to each other in a common plane 126. Spaced a certain distance z above this common reception plane 126 is situated a transmission coil 116 that is likewise situated coaxial to the reception system 112 and 114.

The line segments of the reception conductor loops 112 and 114 have a planar, one-layered winding geometry. Such an embodiment of the reception conductor loop system 112, 114 opens up the possibility of minimizing the capacitance per unit length in a simple fashion. In this case, it is possible to keep the distance from winding to winding high and thus to keep the parasitic capacitance per unit length low.

In a manner that will be described hereinafter, the reception conductor loops are embodied in the print layout, i.e. in the form of conductor path structures or printed conductor loops on the printed circuit board.

An implementation of this kind involves no costs for the production and assembly of reception coils. In addition to the extremely low costs, the replacement of the two reception coils with conductor path structures 112 and 114 on a printed circuit board also has the advantage that the windings have a very high dimensional fidelity. Producing copper structures on printed circuit boards with a precision of up to 25 micrometers does not pose any technical problem at all.

FIG. 2 shows a coil configuration of the sensor—to illustrate the arrangement of the reception windings—in a likewise very schematic form. For the sake of better visibility, the Z axis 120 is shown here as exaggerated in relation to the X axis 122 and Y axis 124. To clarify this illustration, corresponding dimension values are plotted on the respective axes of the figure, which are not intended to illustrate absolute values, but merely to indicate in arbitrary units the relative magnitude of the scaling of the individual axes in this exemplary embodiment. Also in FIG. 2, a segment has been cut away from the coils to permit better visibility of the cross sections.

The two inversely oriented reception conductor loops 112 and 114 lie in a plane 126, which in this case is intended to symbolize a printed circuit board 100 that is not shown and is defined by the X axis 122 and the Y axis 124 in FIG. 2. This plane 126 can correspond, for example, to the top or bottom surface of the printed circuit board 100. For example, the windings 115 of the reception system 114 can be wound clockwise, whereas the windings 113 of the structures 112 situated further toward the outside are wound counterclockwise. The voltages induced in these windings 113, 115 consequently have opposing signs and with a suitable dimensioning, completely compensate for each other in the absence of external metallic objects.

An excitation and transmission coil 116 is situated above the plane 126 of the printed circuit board 100, i.e. offset in the Z direction 120. It is particularly advantageous if the transmission coil is produced on a winding body that can then be soldered to the printed circuit board 126. The windings 117 of the transmission coil 116 are thus situated a certain predetermined height z above the plane 126 of the printed circuit board. Because of the required stability, the production of winding bodies with wall thicknesses of less than 1 mm is critical. For this reason, it is desirable to have distances of one millimeter and more between the printed circuit board and the transmission coil 116.

The design shown in FIG. 2 is less critical with regard to an incorrect positioning of the transmission coil 116 in the radial direction, i.e. in the X direction 122 and Y direction 124, as has already been demonstrated in the prior art, for example in DE 10122741 A 1. For additional compensation of incorrect positionings in the Z direction 120, in addition to the reception windings 115 and 113 that are known from the prior art and are situated in the outer region of the sensor, the sensor geometry 110 according to the invention shown in FIG. 2 also has compensation windings 130 and 132 situated directly underneath the transmission coil 116. In the exemplary embodiment shown in FIG. 2, these compensation windings are comprised of two clockwise windings 132 and one counterclockwise winding 130. In addition, the compensating action can be optimized by adapting the radii of the compensation windings 130 and 132. The number and position of the compensation windings should be dimensioned so as to compensate for the dependence of the induced voltage in both the reception conductor loop 114 with the reception windings 115 and compensation windings 130 and the reception conductor loop 112 with the reception windings 113 and compensation windings 132 in relation to an incorrect positioning of the transmission coil 116 in the z direction 120. The compensation windings 130 and 132 are situated underneath the transmission coil 116 in the same plane 126 as the reception conductor loop system 112 and 114 and coaxial to it. But the radii of the compensation windings 130 and 132 are selected to be different and smaller than the radii of the reception windings 112 and 114 so that the compensation windings 130 and 132 are situated underneath the transmission coil 116. The compensation windings can therefore also be implemented in the form of printed structures on the common printed circuit board. The radii for the compensation loops 130 and 132 can, however, also be larger or smaller than the radius of the windings 117 of the transmission coil 116.

This compensation occurs because the lesser influence of the incorrect positioning of the transmission coil 116 on the winding system 113 of the reception conductor loops 112 due to the greater distance is compensated for by the fact that receiver compensation windings 132 of the reception conductor loops 112 are likewise situated a very small distance from the transmission coil 116. These compensation windings 132 are thus influenced even more by a shifting of the transmission coil 116. A very slightly incorrect positioning of the transmission coil 116 therefore does not affect the total voltage induced in the reception windings, i.e. including their compensation windings 130 and 132. Naturally, this occurs in ideal fashion only for a narrow window in the vicinity of the actually provided Z position of the transmission coil 116. The required production tolerance of the wall thickness of a winding body for the transmission coil 116 can thus be reduced, for example, to an easily achievable ±0.1 mm.

The greater ease of production that this achieves in a sensor geometry 110 according to the exemplary embodiment in FIG. 2, however, is counterbalanced by the fact that the addition of the compensation windings 130 and 132 beneath the excitation coil 116 negatively influences the directivity characteristic of the inductive sensor.

Figure 3:
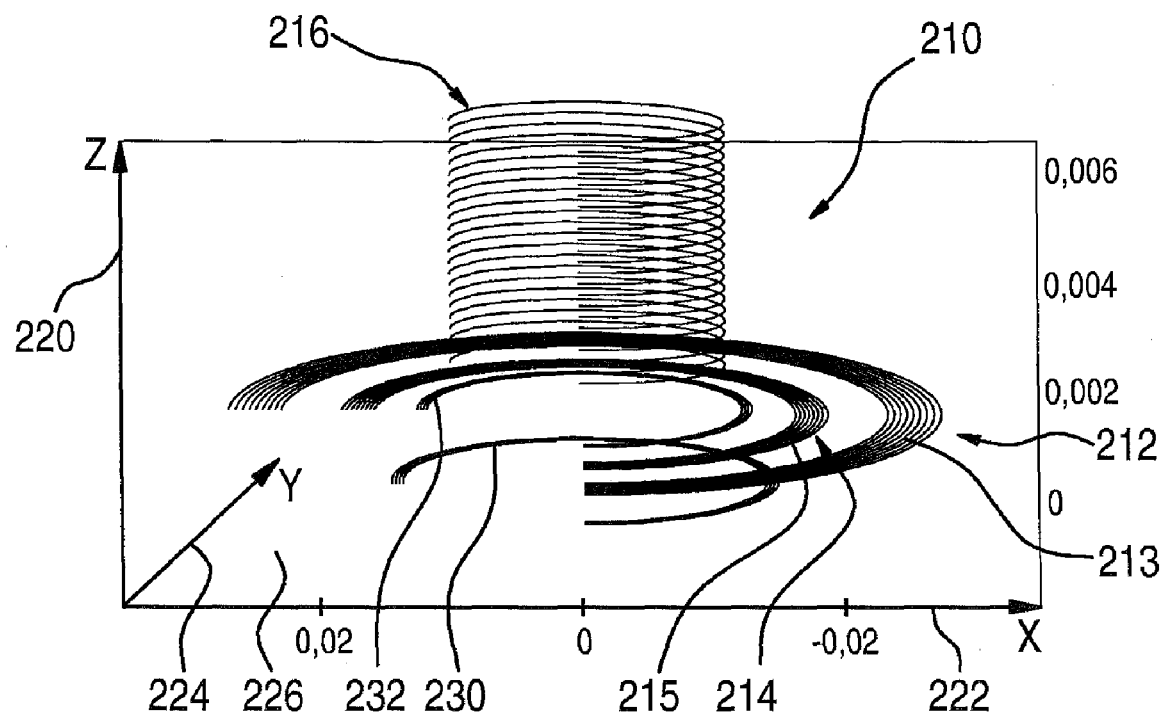
FIG. 3 is a depiction analogous to that in FIG. 2 of a second exemplary embodiment of a coil arrangement of the sensor according to the invention.

In an alternative exemplary embodiment of a sensor geometry 210 for the sensor for locating metallic objects according to the invention, FIG. 3 shows a compensation layout that significantly mitigates the problem of the distorted directivity characteristic. In this exemplary embodiment, the clockwise and counterclockwise-wound compensation windings 230 and 233 are mounted on two different sides, for example, of a printed circuit board 200, which the plane 226 is intended to represent. A printed circuit board of this kind must therefore be embodied as at least two-layered. But it is also possible to use printed circuit boards with even more layers. Because the inner compensation winding pairs can then be embodied with virtually the same radius, the directivity characteristic of the sensor is no longer distorted at large distances from metallic objects. Since the radius of the compensation windings 230 and 232 is then virtually equal, their turns numbers are each used to enable an optimized adaptation of the positioning tolerance for the transmission coil 216.

The improved directivity characteristic of the sensor according to the invention in FIG. 3 can be clearly explained by the following qualitative argument. If the reception windings 215 and 230 or 213 and 232 were supplied with current, then the inner compensation windings 230 and 232 distributed on the top and bottom surfaces of the printed circuit board 200 would generate a magnetic field, which would correspond to a good approximation of a magnetic quadrupole. At distances that are large in relation to the distance between the two compensation windings systems 230 and 232 on the top and bottom surface of the printed circuit board 200, the field therefore disappears very quickly as the distance increases. Even at a distance of approximately one centimeter from the printed circuit board, the inner compensation windings 230 and 232 no longer contribute perceptibly to the overall magnetic field. These considerations that apply to the use of compensation windings for magnetic field generation can also be applied to the reception characteristics that occur.

While the compensation windings 230 and 232 according to FIG. 3 yield only a slight deformation of the reception characteristic, their influence on the voltage induced in the reception windings 215 and 213 should not be disregarded.

The transmission coil 216 is situated a distance of approx. 1 mm above the printed circuit board; this distance is approximately the same as the thickness of the printed circuit board itself.

Figure 4:
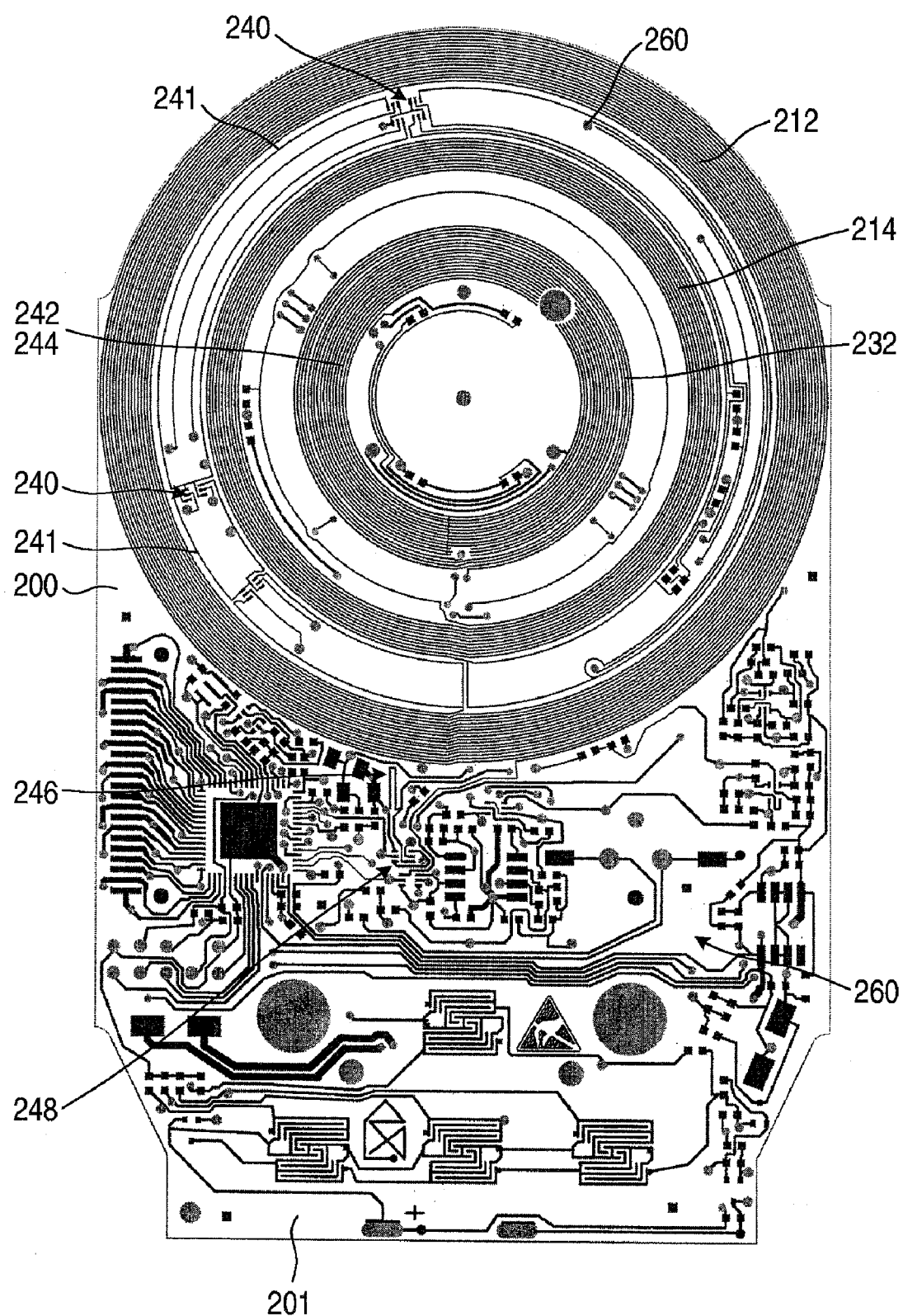
FIG. 4 shows a layout for a conductor geometry of the reception windings of the sensor according to the invention, in a view of a printed circuit board structure.
Figure 6:
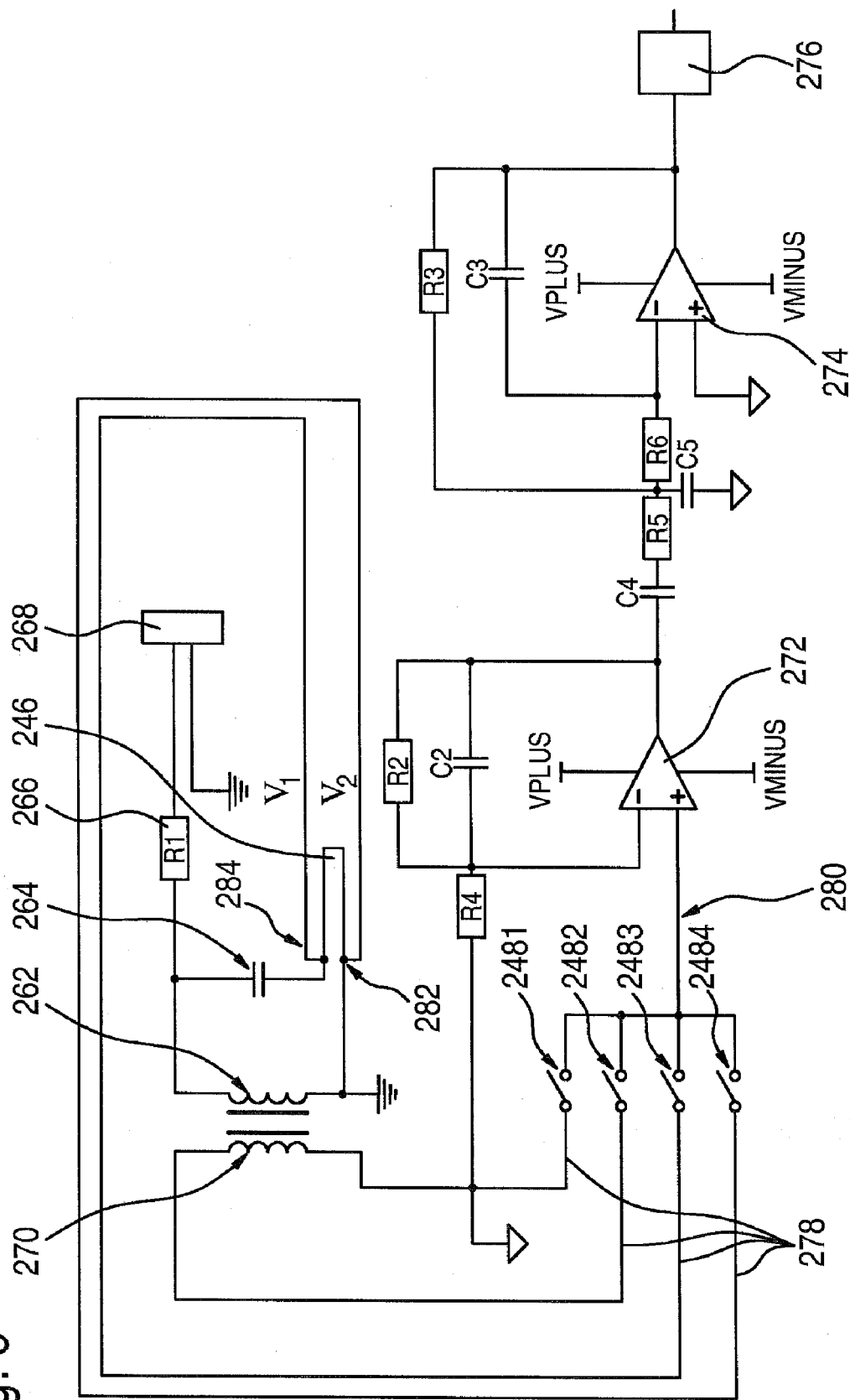
FIG. 6 is a schematic depiction of an evaluation circuit for evaluating and preparing measurement signals of the sensor according to the invention.
Figure 7:
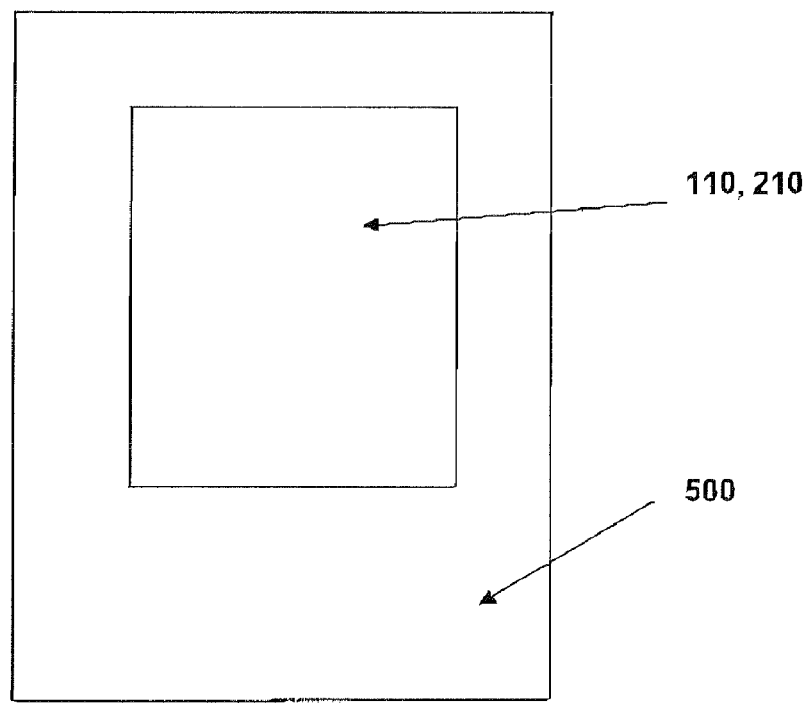
FIG. 7 is a schematic depiction of a measuring device with the sensor according to the invention.

In a view of the top surface 201 of the printed circuit board 200, FIG. 4 shows one possible implementation of the above-illustrated reception conductor loop system and compensation windings in the form of printed structures on a printed circuit board 100 and 200. Only the layout of the printed circuit board 200 is described below. The same applies to a printed circuit board 100 according to FIG. 2. The conductor path structures in the region of the evaluation circuit 260 have only been shown insofar as they are required for explaining the layout of the sensor according to the invention. Details of the evaluation circuit are shown in FIG. 6 and will be described at the appropriate point.

The reception conductor loops 112 and 114 or 212 and 214 on the printed circuit board 200 replace the reception coils usually provided in compensation sensors. The direct consequence of using conductor tracks in the reception system of the sensor is that the possible number of conductor loops in the reception path is no longer a few thousand, but must be drastically reduced to realistically 10 or at most 20 windings. In the narrower sense, for these conductor geometries in the frequency range of up to 100 kHz, it no longer makes sense to speak of "coils" in the conventional sense, which is why this document generally refers to them as reception conductor loops or reception conductor structures. For example, the inductance of an ensemble of conductor loops with a 40 mm diameter is only about 10 µH with 11 windings. A realistic working frequency of 5 kHz thus yields an impedance of only around 0.3 ohm, which is almost negligible in comparison to the conductor structure's ohmic resistance of about 10 ohm.

Also implemented in the form of a conductor path structure of this printed circuit board 200, comblike conductor structures 242 are provided, which constitute a shielding electrode 244 that provides an electrical shielding between the reception conductor loops 112 and 114 or 212 and 214 on the one hand and the transmission coil 116 or 216 on the other by virtue of being connected to ground potential. These structures do not add any additional costs whatsoever to the production of the sensor according to the invention. In particular, with the advantageous planar winding geometry, flat shielding structures can also deliver sufficiently good results.

In the shielding lines, however, care must be taken that no current loops are formed within the shielding geometry. It is therefore advantageous to compose meandering or comb structures out of the thinnest possible individual conductors, which, in the mathematical sense, constitute a simply contiguous area.

The transmission coil 116 or 216 is not shown in FIG. 4 because it is situated in a plane that is vertically offset in relation to the plane of the printed circuit board 200. It is particularly preferable if, as described above, the transmission coil 116 or 216 is produced on a winding body that is then soldered to the printed circuit board 200. The windings of the transmission coil are thus situated a certain predetermined height above the plane of the printed circuit board. In a particularly advantageous fashion, contact pins that are let into an injection molded part produce the electrical contact between the excitation coil and the printed circuit board 200 by virtue of the fact that the contact pins are soldered into bores provided for them in the printed circuit board of the sensor. In order to permit a stable mechanical contact, it is helpful to use more than the two electrically required contact pins, for example by adding one or two blind pins, i.e. ones that are not electrically contacted. In this manner, the excitation coil can also be mechanically fixed in a precise fashion by means of the soldering process.

In addition, electrical switching means 240, which can be embodied for example as transistors, in particular FET switches, are provided on the printed circuit board 200 and make it possible to vary the geometry of the reception conductor loop system by connecting or disconnecting additional conductor loops 241 to and from the reception conductors 112 and 114 or 212 and 214. This principle is based on the fact that the original reception conductor loops are complemented by or reduced by one or more additional conductor loops 241 or only by fractions thereof. To carry out this variation of the effective "turns number" of the reception conductor loop system, the switching means 240 are provided, which in corresponding tuning processes, connect or disconnect the system to or from inductive compensation modules in the form of conductor loops 241 or fractions of conductor loops. With a suitable design of the conductor loops of the reception system, voltages are induced in these conductor loop parts 241, which compensate precisely for the incorrect voltages in the detector, which can arise, for example, due to production tolerances in the winding body of the excitation coil.

In comparison with tuning methods that work on the excitation side of the detector, the claimed circuitry-based implementation on the reception side is; significantly simpler and more reasonably priced because, for example, comparatively high-impedance switching means can be used since only infinitesimally low currents flow in the reception path in comparison to the excitation coil.

Compensation windings 232 of the reception conductor loop systems 112 and 114 or 212 and 214 are also provided on the shared printed circuit board 200. These compensation windings 232 are likewise embodied in the form of conductor paths or conducting structures of the printed circuit board 200. In this case, the number and position of the respective compensation windings are dimensioned so that the dependence of the induced voltage in the reception conductor system 112 and 114 or 212 and 214 on an incorrect vertical positioning of the excitation coil 116 or 216, i.e. in the Z direction, is, compensated for as precisely as possible. A production-dictated slightly incorrect positioning of the excitation coil in the Z direction therefore no longer affects the total voltage induced in the reception conductor loops.

The detector geometry according to the invention yields a significantly reduced tolerance sensitivity with regard, to the vertical (Z direction) positioning of the excitation coil above the plane 126 of the reception coils. In addition to the reception conductor loops of the receiver in the outer region of the transmission coil, in this case the compensation windings are provided directly underneath the vertically offset transmission coil and excitation coil.

The components for triggering the coil 116 or 216 of the sensor and for the evaluation and processing of the measurement signal are also integrated into the printed circuit board 200 that supports and constitutes the reception conductor loop systems 112 and 114 or 212 and 214. For example, a shunt resistor 246 is thus provided, which makes it possible, in a manner that will be described below, to measure the current in the excitation branch of the sensor and consequently to detect a possibly occurring drift in the electronics of the sensor according to the invention. With the knowledge of the current and the phase position of the current in the excitation branch, it is therefore possible to mathematically compensate for a reduction in the measurement amplitude that is caused by the fact that the current in the excitation signal decreases due to an increase in the copper resistance of the excitation coil that rises along with the temperature.

It is likewise possible in this way to carry out a temperature measurement as long as the circuit in the excitation branch is designed so that only the copper resistance is subject to a significant temperature drift.

Because of the high amplification factor of the evaluation circuit, very low voltage amplitudes in the shunt resistor 246 suffice so that this, too can be advantageously embodied in the form of a short meandering structure comprised, for example, of copper conductor tracks on the printed circuit board 200, thus eliminating the need for another, additional, and separate component. In practice, roughly 1-2 cm of conductor structure suffices for this purpose.

Furthermore, among other things, four additional switching elements 248 are provided on the printed circuit board 200 and are able to connect various input signals to the input of an amplifier stage of the evaluation circuit. The function of these switching elements 248 will be described in conjunction with FIG. 6.

Figure 5:
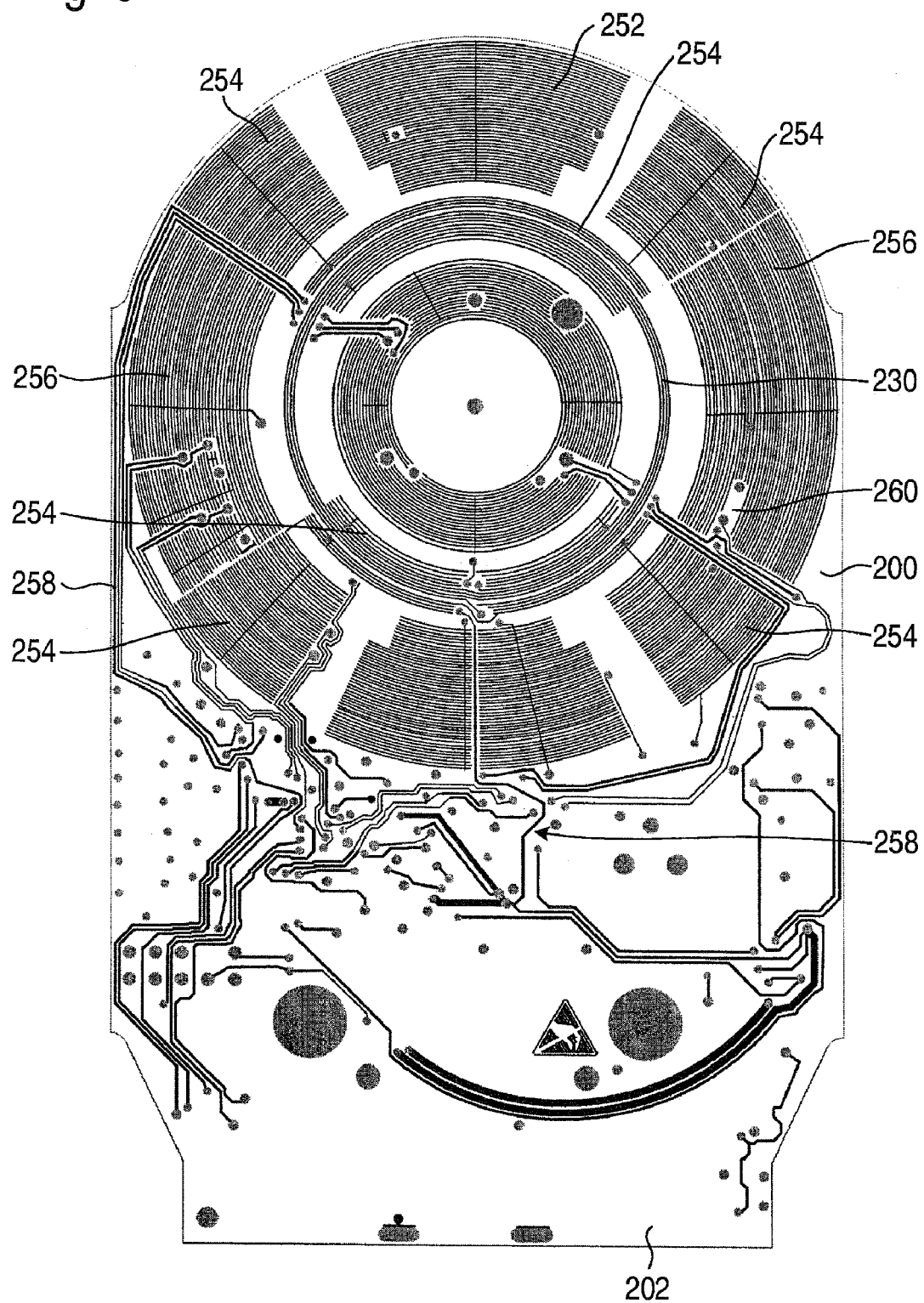
FIG. 5 is a bottom view of the circuit board structure of the printed circuit board according to FIG. 4.

FIG. 5 shows the underside 202 of the printed circuit board 200 from FIG. 4. As described above in conjunction with FIG. 3, the underside of the printed circuit board 200 is provided with compensation windings 230 of the reception conductor loops 112 and 114 or 212 and 214 of the sensor according to the invention, likewise in the form of conductor path structures.

In addition, the exemplary embodiment of the sensor according to the invention in FIGS. 4 and 5 has other sensors that are likewise provided on the printed circuit board 100 and are advantageously likewise embodied in the form of conductor structures of this printed circuit board 100: The conductor structures 250 thus form a 50 Hz AC sensor, for example, which, as a passive sensor, makes it possible to detect line elements through which current is flowing.

The invention makes it possible to implement a reasonably priced sensor that renders superfluous as many cost-intensive components and device elements as possible by virtue of the fact that the printed circuit board of the sensor is used not only as a support for electronic circuits, but is also, as a functional part on which the corresponding elements are provided, an integral component of the sensor. The conductor path structures 252, 254, and 256 thus constitute electrodes of a "stud finder", advantageously permitting the measuring device according to the invention to search for wood material, for example) which is concealed in or behind a wall. In this case, the conductor path structures 252 constitute the receiver and the structures 254 and 256 constitute the exciter and transmitter for the wood-finding device integrated into the sensor according to the invention.

The individual electrodes of the sensor according to the invention are connected to the evaluation circuit 160 via corresponding conductor paths 258 and contacts 260 on the printed circuit board 100.

The method according to the invention for evaluating the measurement signal of the claimed device makes it possible to use the various sensors in parallel, quasi-parallel, and serial fashion. In the quasi-parallel operating mode, a very rapid switching between individual sensors occurs and the corresponding detection signals are generated, measured, and evaluated or possibly stored temporarily for evaluation. In this case, it is likewise possible to choose between an automatic and user-predetermined selection of the sensors.

Specific circuitry-based embodiments of the sensor according to the invention will be presented below. On the reception side, if the wound coils usually used in the prior art are replaced according to the invention with conductor paths on a printed circuit board, then it is no longer possible to use the conventional switching method in which a resonant circuit is provided as a matching circuit both on the transmission side and on the reception side. The reason behind this on the one hand is the fact that if the reception conductor loops were considered as a coil and an index number for their quality were calculated, this would yield values on the order of Q=0.03. The extremely low inductances in combination with the high-impedance copper resistance are the reason why typically, printed coils are only currently used starting at frequencies of approximately 100 MHz and for all practical purposes, have not previously played any role at frequencies below 1 MHz.

A layout of resonant circuits with the aid of the reception "inductance" is therefore not constructive for the evaluation circuit of the inductive sensor according to the invention. On the other hand, in actual practice, even with infinitesimal ohmic resistance, a resonance of less than or equal to 100 kHz can only be achieved with difficulty at the frequencies useful for inductive sensors, because the inductance per unit length is only on the order of a few tens of µH. The required resonant circuit capacities would have to assume prohibitively high values, which are not achievable in actual practice. As a result, in the reception path of the sensor according to the invention, when a reception coil is eliminated, it is not possible to increase the resonance in order to raise the signal voltage. In addition to the lack of a resonance increase, there is also a drop in the signal strength when using printed conductor, loops in comparison to wound detector coils with for example 2000-6000 and windings of the kind proposed in EP 102989 A1 since printed conductor loops on the printed circuit board with significantly more than 10-20 windings can only be implemented with an increase in complexity.

A first consequence of the elimination of a resonant circuit for the evaluation of the measurement signal of the sensor according to the invention is that the signal amplitudes to be detected are significantly lower. In the case of thin copper objects to be located, the signal amplitudes to be amplified are only on the order of a few tens of nV. With voltages of this magnitude and with necessary amplification factors of about 100,000 in the evaluation circuit of the sensor according to the invention, it is thus in general no longer possible to avoid an overcoupling of interference signals from the power supply of the amplifier circuit to the signal path of the sensor, or else this can only be avoided with an extreme degree of complexity.

At the low signal amplitudes, it is also necessary to use amplifiers with particularly low levels of voltage noise. Operational amplifiers with bipolar input stages are particularly suitable in this case because the source impedance of the reception windings of about 30 ohm is very low.

FIG. 6 shows a circuit according to the invention for evaluation and preparation of the total signal voltages that are induced in the individual reception windings of the sensor according to the invention.

The inductance 262 in this case denotes the excitation coil 116 or 216 (see FIGS. 2 and 3) conventionally wound out of wire, which, together with the capacitance 264, comprises a resonant circuit and is connected via a resistance 266 to a voltage source 268. The inductance 270 in FIG. 6 denotes the inductance of the reception conductor loops 112, 114 or 212, 214, which inductance is comprised of the conductor tracks 113 and 115 or 213 and 215 on the printed circuit board 200, at which the weak measurement signal can be picked up in the form of the induced voltage.

In the exemplary embodiment according to FIG. 6, the evaluation circuit is comprised, among other things, of a two-stage amplifier with two operational amplifiers 272 and 274 whose outputs can be connected, for example, to an analog/digital converter (ADC) 276. The first particularly low-noise amplifier stage 272 initially amplifies the measurement signal, which is then prepared in a second stage 274 with a bandpass characteristic (e.g. for a digitizing in an ADC). It should be noted that the operational amplifier 272 has a bipolar input stage and that low-impedance resistances are used in the feedback path of the first amplifier stage. The second amplifier stage assures that higher harmonics of the excitation field are filtered out of the measurement signal.

Before the first amplifier stage 272 there are a series of switches 248, which can connect various input signals 278 to the input 280 of the amplifier stage 272. It is thus possible, for example when the sensor according to the invention is operating in measuring mode, to connect the voltage induced in the detector coil 270, to the input of the amplifier stage 272 by closing a switch 2482.

Due to the sow signal level, however, it is not possible in practice to rule out the generation of an interference signal inside the amplifier, even if no voltage is being induced in the reception system 270. Possible sources of such an interference signal, as has been explained above, include, for example, couplings between interference signals of the power supply of the operational amplifier and the input of the amplifier stages.

In order to be able to measure these interference signals and subtract them from the actual measurement signals, with the method for evaluating measurement signals according to the invention, it is alternatively possible not to open switches 2482, but instead to connect the input 280 of the amplifier 272 directly to ground potential with the aid of the switch 2481. The interference voltages to be measured in this switch configuration can be subtracted from the voltages determined in the measurement configuration (the switch 2482 is then closed).

With measurement signals on the order of only a few nV, an effective suppression of the background noise, in particular of the noise in the amplifier, is crucial to the measurement precision. The operational amplifier from FIG. 6 is therefore provided with a bipolar input circuit at least in the first amplifier stage. The required noise suppression corresponds to a narrow-band filtration of the measurement signal. If one assumes an input-dictated resistance noise in the amplifier on the order of 4 nV/$\sqrt{Hz}$, then the noise filter would need to have a bandwidth of only a few tens of Hz. In analog technology, such narrow-band filters can only be implemented with a high degree of complexity and at a high cost.

An evaluation process with a digital noise suppression has therefore been advantageously implemented for the inductive sensor according to the invention that is equipped with a reception conductor loop system in the print layout in the form of a receiving component. With a filtration of this kind, the measurement signal at the output of the measuring amplifier is first synchronously digitized by an analog/digital converter (ADC) and is then digitally processed by a subsequent digital circuit or a microprocessor. This digital circuit component also suitably generates the drive voltage, which triggers the excitation coil. It is particularly useful to digitize the measurement signal with a frequency (e.g. ~20 kHz) that is four times or eight times the frequency of the excitation magnetic field (e.g. ~5 kHz). It is then possible to digitize the voltage that is present at the output of the amplifier stage in the reception branch in a phase-synchronous fashion with the excitation voltage and in this way, to mathematically achieve a digital noise filtration. This makes it possible to achieve effective noise bandwidths on the order of a few Hertz, without incurring high costs and involving a high degree of complexity.

In order to be able to compensate for the drift of the circuit and in particular of the transmission coil, which is due, for example, to the fact that the copper resistance of the excitation coil changes along with the temperature, the circuit includes two additional switches 2483 and 2484 that make it possible to pick up a voltage V1 and V2 on two sides of a shunt resistor 246, which voltage is proportional to the current flowing in the excitation resonant circuit. The use of two pickup points 282 (for V2) and 284 (for V1) is advantageous because there can be slight differences between the ground potential of the excitation circuit and the ground potential of the reception circuit, which can easily be of a magnitude equivalent to that of the measurement signal. With the knowledge of the current and the phase position of the current in the excitation branch, however, it is possible to mathematically compensate for a reduction in the measurement amplitude, for example. Such a drop in the measurement amplitude can be caused, among other things, by the fact that the current in the excitation signal decreases due to an increase in the copper resistance of the excitation or transmission coil that rises along with the temperature.

Because of the high amplification factor of the evaluation circuit, very low voltage amplitudes in the shunt resistor 246 are sufficient so that this can also be advantageously embodied in the form of a short meandering structure comprised of copper conductor tracks on the printed circuit board, thus, eliminating the need for an additional, separate component. In practice, roughly 1-2 cm of conductor structure suffices for this purpose.

In actual practice, it is also suitable not to implement the switching means 2181 through 2484 in the form of mechanical switches, but to use relays or semiconductor switches in their stead. Field effect transistors in particular have become the switching means of choice. In this connection, it is also possible to control the switch position by means of a microcontroller and, for example, to cyclically carry out an automatic tuning of the crosstalk signal generated by parasitic coupling between the supply of the operational amplifier and the input of the evaluation circuit.

If the same analog amplifier 272 or 274 is used to measure measurement signals (switch 2482), calibration signals (switches 2483 and 2484), and interference signals (switch 2481), then this has the additional advantage that drift effects and series tolerances within the amplifier subassemblies act in identical fashion on the different measurement signals. The method according to the invention therefore makes it possible to compensate mathematically for a long-term drift in the amplifier subassembly.

In order to be able to effectively suppress the capacitive coupling, it is possible to provide, shielding elements on the printed circuit board 200, between the wound excitation coil and the reception conductor structures, which shielding elements are advantageously also embodied in the form of conductor path structures 242 and connected to ground potential. These structures do not incur any additional production costs whatsoever. In particular, with the planar winding geometry according to the invention, even flat shielding structures can deliver good results.

When constructing and laying-the-shielding lines 242 and 244, however, care must be taken that no current loops can form within the shielding geometry It is therefore useful to compose meandering or comb structures out of the thinnest possible individual conductors, which, in the mathematical sense, constitute a simply contiguous area. The same is true for the structures provided on the underside for the passive and active capacitive sensors (256, 254, 252).

The sensor according to the invention can advantageously be integrated into a measuring device. A measuring device of this kind can in particular be embodied in the form of a hand-held metal locating device or the sensor according to the invention can include the metal locating capacity as an auxiliary function.

Furthermore, the sensor according to the invention can also be advantageously integrated into a machine tool, for example a drilling tool, in order to permit a user to operate this machine safely.

The invention makes it possible to implement a reasonably priced sensor that renders superfluous as many cost-intensive components and device elements as possible by virtue of the fact that a printed circuit, board of the sensor is used not only as a support material for the electronic circuits, but is also, as a functional part, an integral component of the sensor. The sensor for locating metal objects according to the invention only requires one separate coil. This is achieved in particular by replacing the typically wound reception coils that are known from the prior art with conductor tracks on a printed circuit board of the evaluation circuit of the sensor and by embodying suitable conductor tracks on the printed circuit board that serve to shield the excitation or transmission coil and reception conductor loops and result in a suppression of the capacitive coupling between the transmission and reception path of the sensor.

It is also possible in turn to embody a shunt resistor directly by means of a conductor path structure on the printed circuit board; the shunt resistor makes it possible to measure the current in the excitation branch of the sensor and therefore to determine and compensate for a temperature drift of the current in the excitation coil.

Thanks to the embodiment of the sensor geometry according to the invention, the claimed sensor for locating metallic objects delivers good measuring results even without requiring a regular calibration process to be carried out before each measurement.

The sensor for locating metallic objects according to the invention is not limited to the exemplary embodiments shown in the figures.

The sensor according to the invention is not limited to the use of a single transmission coil. The method can also be transferred directly to compensation geometries that use more than one excitation coil, for example in order to also be able to determine the spatial position of a metallic object.

In particular, the method described here also makes it possible to find embodiments for basic configurations of a compensation sensor that deviate from the one shown in FIG. 1, provided that the geometry and position of the at least one replaced reception coil approximately permit the necessary flat geometry required for the use of a printed circuit board. The invention and in particular, the use of conductor path structures of a printed circuit board as a reception conductor loop system are in no way limited to the compensation sensor type.

In particular, it is also conceivable to use a combination of printed circuit board-bound reception conductor loops and reception windings in a conventionally wound coil in W the reception path. This applies in particular to the case in which the printed circuit board-bound reception conductor loops also actually contribute substantially—to the induction voltages imparted by metal objects. One consequence of this would be the fact that the conventionally wound supplementary coil would need to have an unusually small number of turns. The potential advantage of such a combined embodiment in the reception path lies, among other things, in the fact that here, too, the above-described method can successfully reduce the requirements for the positioning tolerance and production tolerance of the wound coils through suitably embodied compensation loops on the printed circuit board.

It is also conceivable not to use a two-layered printed circuit board for the sensor, but instead to use a multilayered printed circuit board, for example in order to increase the possible number of windings in the reception path, to shift the reception conductor loops or the positioning tolerance compensation loops totally or partially to inner layers, to place components above the reception conductor loops, or to be able to suppress the capacitive coupling of the excitation in the reception branch more effectively.

In particular, the sensor according to the invention is not limited to the use of circular coils or conductor loop systems. By contrast with the reception conductor loop systems shown in the figures, each conductor loop system or individual conductor loops can have a shape that deviates from that of a circle or a circular arc and can be comprised of one or more windings.

The invention claimed is:

1. A sensor for locating metallic objects, in particular a metal sensor for building materials, having at least one transmission coil (116, 216) for inducing a flux and at least one reception conductor loop system (112, 212) for receiving said flux modified by a metallic object, wherein said at least one transmission coil (116, 216) and said at least one reception conductor loop system (112, 212) are inductively coupled to one another, wherein the reception conductor loop system (112, 212) is comprised of conductor structures on a printed circuit board (100, 200), wherein a second reception conductor loop system (114, 214) is provided for receiving said flux, wherein said second reception conductor loop system (114, 214) is situated coaxial to the first reception conductor loop system (112, 212), in a common first plane (126, 226) with it on the printed circuit board (100, 200), so that a presence of a metallic object is determined when changes in inductive properties caused by the metallic object are registered by said first and second reception conductor loop systems, and wherein the sensor operates in a frequency range between 1 kHz and 10 kHz.

2. The sensor as recited in claim 1, wherein an electric shielding electrode (242, 244) is provided between the at least one transmission coil (116, 216) and at least one reception conductor loop system (112, 114, 212, 214), and the electric shielding electrode (242, 244) is embodied on the printed circuit board (100, 200).

3. The sensor as recited in claim 1, wherein a shunt resistor (246) connected in series with at least one transmission coil (116, 216) is provided, which is embodied as a conductor path structure on a printed circuit board (100, 200).

4. The sensor as recited in claim 1, wherein at least one transmission coil (116, 216) is mounted on a winding body and the winding body is fastened to a printed circuit board (100, 200).

5. The sensor as recited in claim 1, wherein at least one transmission coil (116, 216) is situated vertically offset from the plane (126, 226) of the printed circuit board (100, 200).

6. The sensor as recited in claim 5, wherein additional compensation conductor loops (130, 132, 230, 232) of at least one reception conductor loop system (112, 114, 212, 214) are provided in the vicinity of at least one transmission coil (116, 216) on the printed circuit board (100, 200).

7. The sensor as recited in claim 6, wherein the compensation conductor loops (130, 132, 230, 232) are embodied in the form of conductor structures on the printed circuit board (100, 200).

8. The sensor as recited in claim 7, wherein the compensation conductor loops (130, 132, 230, 232) are provided on two opposite sides (201, 202) of the printed circuit board (200).

9. The sensor as recited in claim 8, wherein the compensation conductor loops (130, 132, 230, 232) are oriented in opposite directions while having virtually the same geometry.

10. The sensor as recited in claim 6, wherein the compensation conductor loops (130, 132, 230, 232) are embodied in the form of conductor structures on superposed inner layers of an at least two-layered printed circuit board.

11. The sensor as recited in claim 5, wherein additional compensation conductor loops (130, 132, 230, 232) of at least one reception conductor loop system (112, 114, 212, 214) are provided beneath the at least one transmission coil (116, 216) on the printed circuit board (100, 200).

12. The sensor as recited in claim 1, wherein at least one tuning conductor loop (241) is provided on the printed circuit board (100, 200) and is connectable to the reception conductor loop system (112, 114, 212, 214) via switching means (240).

13. The sensor as recited in claim 12, wherein semiconductor switches, in particular field effect transistors, are used as the switching means (240).

14. A measuring device (500), in particular a hand-held locating device, having at least one sensor as recited in claim 1.

15. The sensor according to claim 1, wherein the sensor operates in a frequency range between 4 to 6 kHz.

16. A method for evaluating the measurement signal of a sensor comprising:
   providing a sensor as recited in claim 1; and
   digitizing the measurement signals.

17. The method as recited in claim 16, wherein a narrow-band digital filtration is carried out in order to reduce the noise bandwidth by means of digital generation of an excitation signal of the frequency f and phase-synchronous analog/digital conversion of a measuring amplifier output signal of an evaluation circuit of the sensor.

18. The method as recited in claim 17, wherein the phase-synchronous analog/digital conversion of the measuring amplifier output signal occurs with the frequency $f_d$=4 n f, i.e. at a frequency 4f four times the frequency of the excitation field or an integral multiple n of this frequency.

19. A sensor for locating metallic objects, in particular a metal sensor for building materials, having at least one transmission coil (116, 216) for inducing a flux and at least one reception conductor loop system (112, 212) for receiving said flux modified by a metallic object, wherein said at least one transmission coil (116, 216) and said at least one reception conductor loop system (112, 212) are inductively coupled to one another,
   wherein the reception conductor loop system (112, 212) is comprised of conductor structures on a printed circuit board (100, 200),
   wherein a second reception conductor loop system (114, 214) is provided for receiving said flux, wherein said second reception conductor loop system (114, 214) is situated coaxial to the first reception conductor loop system (112, 212), in a common first plane (126, 226) with it on the printed circuit board (100, 200), and
   wherein a shunt resistor (246) connected in series with at least one transmission coil (116, 216) is provided, which is embodied as a conductor path structure on a printed circuit board (100, 200) so that a presence of a metallic object is determined when changes in inductive properties caused by the metallic object are registered by said first and second reception conductor loop systems.

20. A sensor for locating metallic objects, in particular a metal sensor for building materials, having at least one transmission coil (116, 216) for inducing a flux and at least one reception conductor loop system (112, 212) for receiving said flux modified by a metallic object, wherein said at least one transmission coil (116, 216) and said at least one reception conductor loop system (112, 212) are inductively coupled to one another,
   wherein the reception conductor loop system (112, 212) is comprised of conductor structures on a printed circuit board (100, 200),
   wherein a shunt resistor (246) connected in series with at least one transmission coil (116, 216) is provided, which is embodied as a conductor path structure on a printed circuit board (100, 200),
   further comprising an evaluation circuit (260), which is connectable with both the shunt resistor (246) and at least one reception conductor loop system (112, 114, 212, 214) via switching means (248), wherein the evaluation circuit (260) has at least one bipolar input stage so that a presence of a metallic object is determined when changes in inductive properties caused by the metallic object are registered by said reception conductor loop system.

21. A sensor for locating metallic objects, in particular a metal sensor for building materials, having at least one transmission coil (116, 216) and at least one reception conductor loop system (112, 212) that are inductively coupled to one another,
   wherein the reception conductor loop system (112, 212) is comprised of conductor structures on a printed circuit board (100, 200),
   wherein a second reception conductor loop system (114, 214) is provided, which is situated coaxial to the first reception conductor loop system (112, 212), in a common first plane (126, 226) with it on the printed circuit board (100, 200), and
   wherein the sensor operates in a frequency range between 1 kHz and 10 kHz wherein an electric shielding electrode (242, 244) is provided between the at least one transmission coil (116, 216) and at least one reception conductor loop system (112, 114, 212, 214), and the electric shielding electrode (242, 244) is embodied on the printed circuit board (100, 200).

22. A sensor for locating metallic objects, in particular a metal sensor for building materials, having at least one transmission coil (116, 216) and at least one reception conductor loop system (112, 212) that are inductively coupled to one another,
   wherein the reception conductor loop system (112, 212) is comprised of conductor structures on a printed circuit board (100, 200),
   wherein a second reception conductor loop system (114, 214) is provided, which is situated coaxial to the first reception conductor loop system (112, 212), in a common first plane (126, 226) with it on the printed circuit board (100, 200), and
   wherein the sensor operates in a frequency range between 1 kHz and 10 kHz, and
   wherein at least one transmission coil (116, 216) is situated vertically offset from the plane (126, 226) of the printed circuit board (100, 200), and
   wherein additional compensation conductor loops (130, 132, 230, 232) of at least one reception conductor loop system (112, 114, 212, 214) are provided in the vicinity of at least one transmission coil (116, 216) on the printed circuit board (100, 200).

23. A sensor for locating metallic objects, in particular a metal sensor for building materials, having at least one transmission coil (116, 216) and at least one reception conductor loop system (112, 212) that are inductively coupled to one another,
   wherein the reception conductor loop system (112, 212) is comprised of conductor structures on a printed circuit board (100, 200),
   wherein a second reception conductor loop system (114, 214) is provided, which is situated coaxial to the first reception conductor loop system (112, 212), in a common first plane (126, 226) with it on the printed circuit board (100, 200), and
   wherein the sensor operates in a frequency range between 1 kHz and 10 kHz, and
   wherein at least one transmission coil (116, 216) is situated vertically offset from the plane (126, 226) of the printed circuit board (100, 200), and
   wherein additional compensation conductor loops (130, 132, 230, 232) of at least one reception conductor loop system (112, 114, 212, 214) are provided beneath the at least one transmission coil (116, 216) on the printed circuit board (100, 200).

24. A sensor for locating metallic objects, in particular a metal sensor for building materials, having at least one transmission coil (116, 216) for inducting a flux and at least one reception conductor loop system (112, 212) for receiving said flux modified by a metallic object, wherein said at least one transmission coil (112, 216) and said at least one reception conductor loop system (112, 212) are inductively coupled to one another, wherein the reception conductor loop system (112, 212) is comprised of conductor structures on a printed circuit board (100,200), wherein a second reception conductor loop system (114, 214) is provided for receiving said flux, wherein said second reception conductor loop system (114, 214)) is situated coaxial to the first reception conductor loop system (112,212), in a common first plane (126, 226) with it on the printed circuit board (100, 200), so that a presence of a metallic object is determined when changes in inductive properties caused by the metallic object are registered by said first and second reception conductor loop systems, wherein the sensor operates in a frequency range between 1 kHz and 10 kHz, and wherein a shunt resistor (246) connected in series with at least one transmission coil (116, 216) is provided, which is embodied as a conductor path structure on a printed circuit board (100, 200).

25. The sensor as recited in claim 24, having an evaluation circuit (260), which is connectable with both the shunt resistor (246) and at least one reception conductor loop system (112, 114, 212, 214) via switching means (248).

26. The sensor as recited in claim 24, wherein semiconductor switches, in particular field effect transistors, are used as the switching means (248), and the switching means are situated on the printed circuit board (100, 200).

27. The sensor as recited in claim 25, wherein the evaluation circuit (260) has at least one bipolar input stage.

* * * * *